US010395887B1

(12) United States Patent
Kruit et al.

(10) Patent No.: US 10,395,887 B1
(45) Date of Patent: Aug. 27, 2019

(54) APPARATUS AND METHOD FOR INSPECTING A SURFACE OF A SAMPLE, USING A MULTI-BEAM CHARGED PARTICLE COLUMN

(71) Applicants: Technische Universiteit Delft, Delft (NL); Applied Materials Israel, Ltd., Rehovot (IL)

(72) Inventors: Pieter Kruit, Delft (NL); Ron Naftali, Delft (NL)

(73) Assignees: TECHNISCHE UNIVERSITEIT DELFT (NL); APPLIED MATERIALS ISRAEL, LTD. (IL)

( * ) Notice: Subject to any disclaimer, the term of this patent is extended or adjusted under 35 U.S.C. 154(b) by 37 days.

(21) Appl. No.: 15/900,415

(22) Filed: Feb. 20, 2018

(51) Int. Cl.
*H01J 37/28* (2006.01)
*H01J 37/10* (2006.01)
*H01J 37/22* (2006.01)
*H01J 37/147* (2006.01)

(52) U.S. Cl.
CPC .......... *H01J 37/224* (2013.01); *H01J 37/147* (2013.01); *H01J 37/226* (2013.01); *H01J 2237/152* (2013.01); *H01J 2237/25* (2013.01)

(58) Field of Classification Search
CPC ........ H01J 37/28; H01J 37/3177; H01J 37/10; H01J 37/141; H01J 37/143; H01J 37/1474; H01J 37/1475; H01J 2237/0635; H01J 2237/0822; H01J 2237/0492; H01J 2237/055; H01J 2237/057; H01J 2237/14; H01J 2237/152; H01J 2237/31774; B82Y 10/00; B82Y 40/00

USPC ........... 250/39 R, 398, 310, 396 ML, 492.2, 250/492.21, 492.3, 252.1, 306, 307, 311, 250/346, 491.1, 492.1, 503.1
See application file for complete search history.

(56) References Cited

U.S. PATENT DOCUMENTS

| | | | | |
|---|---|---|---|---|
| 3,371,206 A | * | 2/1968 | Takizawa ........... | B23K 15/0013 219/121.26 |
| 5,834,786 A | * | 11/1998 | White ................... | H01J 37/304 250/492.21 |
| 5,872,358 A | * | 2/1999 | Todokoro .............. | H01J 37/145 250/310 |

(Continued)

FOREIGN PATENT DOCUMENTS

WO     WO2016036246     3/2016    ............. H01J 37/28

*Primary Examiner* — David A Vanore
(74) *Attorney, Agent, or Firm* — Hayes Soloway P.C.

(57) ABSTRACT

Apparatus and method for inspecting a surface of a sample. The apparatus includes a multi-beam charged particle column comprising a source for creating multiple primary beams directed towards the sample, an objective lens for focusing the primary beams on the sample, an electron-photon converter unit having an array of electron to photon converter sections, each section is located next to a primary beam within a distance equal to a pitch of the primary beams at the electro-photon converter unit, a photon transport unit for transporting light from the electron to photon converter sections to a photo detector, and an electron collection unit for guiding secondary electrons created in the sample, towards the electron-photon converter unit. The electron collection unit is arranged to project secondary electrons created in the sample by one of said primary beams to at least one of the electron to photon converter sections.

20 Claims, 5 Drawing Sheets

(56) References Cited

U.S. PATENT DOCUMENTS

| | | | |
|---|---|---|---|
| 6,774,646 B1* | 8/2004 | Han | G01N 23/04 324/754.22 |
| 6,797,969 B2* | 9/2004 | Gerlach | H01J 37/08 250/396 R |
| 7,223,973 B2* | 5/2007 | Kimba | G01N 23/225 250/307 |
| 7,638,777 B2* | 12/2009 | Feuerbaum | B82Y 10/00 250/310 |
| 8,723,117 B2* | 5/2014 | Lanio | H01J 37/09 250/310 |
| 2001/0032938 A1* | 10/2001 | Gerlach | H01J 37/08 250/492.3 |
| 2003/0001095 A1* | 1/2003 | Lo | B82Y 10/00 250/346 |
| 2003/0209676 A1* | 11/2003 | Loschner | B82Y 10/00 250/492.2 |
| 2005/0243415 A1 | 11/2005 | Lowe | G02B 6/0021 |
| 2006/0016989 A1 | 1/2006 | Nakasuji | G01N 23/00 |
| 2006/0169910 A1 | 8/2006 | Frosien | H01J 1/50 |
| 2007/0029507 A1* | 2/2007 | Karel Steenbrink | B82Y 10/00 250/492.22 |
| 2007/0057204 A1* | 3/2007 | Kruit | B82Y 10/00 250/492.23 |
| 2007/0063630 A1 | 3/2007 | Guo | H01J 1/00 |
| 2007/0272856 A1* | 11/2007 | Nijkerk | G01N 23/2251 250/307 |
| 2009/0152460 A1* | 6/2009 | Buhler | H01J 37/3056 250/306 |
| 2009/0200497 A1* | 8/2009 | Adamec | H01J 37/244 250/503.1 |
| 2010/0001204 A1* | 1/2010 | White | H01J 37/147 250/398 |
| 2010/0084566 A1* | 4/2010 | Kim | B82Y 10/00 250/396 ML |
| 2010/0320382 A1* | 12/2010 | Almogy | H01J 37/05 250/307 |
| 2011/0163229 A1* | 7/2011 | Frosien | H01J 37/05 250/310 |
| 2013/0112890 A1* | 5/2013 | Parker | H01J 37/05 250/396 R |
| 2015/0021476 A1* | 1/2015 | Shanel | H01J 37/26 250/307 |
| 2015/0190994 A1 | 7/2015 | De Boer | B32B 37/12 |
| 2016/0314931 A1* | 10/2016 | Fichter | H01J 37/241 |
| 2017/0213697 A1* | 7/2017 | Litman | H01J 37/285 |
| 2017/0227715 A1 | 8/2017 | Frantz | G02B 6/26 |
| 2017/0243717 A1* | 8/2017 | Kruit | H01J 37/28 |
| 2018/0315578 A1* | 11/2018 | Rand | H01J 37/1475 |

* cited by examiner

APPARATUS AND METHOD FOR INSPECTING A SURFACE OF A SAMPLE, USING A MULTI-BEAM CHARGED PARTICLE COLUMN

Embodiments of the invention relate to an apparatus and method for inspecting a surface of a sample, using a multi-beam charged particle column.

BACKGROUND

One of the routine steps in the production process of integrated circuits is the inspection of patterned surfaces, especially when starting up a new design. A substantial part of the whole 300 mm wafer is imaged to check for defects in the pattern and for particles imbedded in the pattern or on top of the wafer. This kind of inspection is presently performed by high-throughput optical microscopy in dedicated instruments.

With the progress in lithography, it is desirable that instruments detect smaller and smaller defects and particles. A problem is that the light scattering from particles rapidly decreases when the particle's size decreases, so the signal-to-background (and noise) ratio is decreasing.

In order to solve this problem, electron beam inspection machines have been used and for some purposes are still in use. Electron beam inspection machines can have a much higher resolution than optical system. However, electron beam inspection machines are limited in the speed at which the electron beam inspection machines can inspect a wafer. In order to increase the speed, multi-beam electron beam systems have been proposed.

US 2007/0272856, described a method and an apparatus for inspecting a specimen surface. The method comprises the steps of generating a plurality of primary beams directed towards the specimen surface, focusing the plurality of primary beams onto respective loci on the specimen surface, collecting a plurality of secondary beams of charged particles originating from the specimen surface upon incidence of the primary beams, converting at least one of the collected secondary beams into an optical beam, and detecting the optical beam. The apparatus described in this Patent Publication comprises a screen with fluorescent material, which screen is disposed between an emitter for generating a plurality of primary beams and the specimen surface, the primary beams are focused at the level of the screen and which screen is constructed such that the primary beams can traverse through holes in the screen. The secondary beams from the specimen surface are directed from the specimen surface towards the screen and are defocused on the screen to provide a spot which covers an area around the holes in the screen. At these spots, the secondary beams are converted into optical beams, which optical beams are then imaged through free space onto a plane in which the optical detector is located.

SUMMARY

A disadvantage of the system described in US 2007/0272856 is, that the spots of secondary beams on the screen are relatively large and spots of adjacent secondary beams are partially overlapping. In addition, the relatively large spots are imaged onto the optical detector, which results in relatively large spots on the detector. Accordingly, the pitch of the primary beams on the specimen surface is relatively large.

A further disadvantage of this system is, that the optical beams are imaged through free space onto the optical detector via an optical lens. Typically the optical lens is arranged next to the array of primary beams so that said optical lens does not obstruct the trajectory of the primary beams. The optical lens is therefore arranged remote from the screen of fluorescent material where the secondary electrons are converted into light, and the numerical aperture and thus the light-gathering ability of the lens is relatively small, which makes the detection of the secondary electrons inefficient.

It is an object to least partially solve at least one of the above identified disadvantages and/or to provide an alternative inspection apparatus, which allows for high throughput inspection of samples, in particular semiconductor wafers.

According to a first aspect, a multi-beam charged particle column for inspecting a surface of a sample is provided, which multi-beam charged particle column comprising:

one or more emitters which are arranged for creating multiple primary charged particle beams directed along trajectories towards the surface of the sample, an objective lens unit for focusing said multiple primary charged particle beams on said sample, an electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit, a photon transport unit for transporting light from said electron to photon converter sections to a light detector, and an electron collection unit comprising multi aperture plates for guiding secondary electrons created in the sample upon incidence of the primary charged particle beams, towards the electron to photon converter sections of the electron-photon converter unit, wherein the electron collection unit is configured for projecting secondary electrons created in the sample by one of said primary charged particle beams to at least one of said electron to photon converter sections arranged at one side with respect to the trajectory of said one of the primary charged particle beams.

According to embodiments of the present invention, the secondary electrons created in the sample by one of the primary charged particle beams are directed to a position at one side with respect to said one of the primary charged particle beam. By configuring the electron collection unit to project the secondary electrons to a position at one side with respect to the primary charged particle beam which produced the secondary electrons, an overlap of the secondary electrons created by multiple primary charged particle beams can at least substantially be prevented, in particular when the electron collection unit is configured for projecting secondary electrons all at a same side with respect to the corresponding primary charged particle beams that created the secondary electrons in the sample. In a preferred embodiment, the secondary electrons created in the sample by one of the primary charged particle beams are directed onto the electron to photon converter section arranged adjacent to or neighboring the trajectory of said one of said primary charged particle beams.

It is noted that in the apparatus described in US 2007/0272856, the secondary beams from the sample are directed towards a screen and are defocused on the screen to provide a spot which covers an area around the holes in the screen. Contrarily to the arrangement in the prior art, the electron collection unit according to embodiments of the present invention, is arranged for projecting the secondary electrons to one side next to the primary charged particle beam. In the apparatus of embodiments of the present invention, an overlap of the spots of secondary electrons from adjacent primary charged particle beams can be prevented, which makes it easier to detect and distinguish the secondary electrons coming from adjacent primary charged particle beams. Accordingly, the detection and evaluation of the secondary electrons from the surface of the sample can be faster, and thus the surface of the sample can be inspected more quickly, which increases the throughput for the inspection of samples.

It is further noted that in the apparatus described in WO 2016/036246, the multi-sensor detector system is arranged at a position which is spaced apart from the array primary electron beams, in a direction perpendicular to an optical axis of the primary electron beams. According to embodiments of the present invention, the electron-photon converter unit comprises an array of electron to photon converter sections, wherein each electron to photon converter section is located next to a primary charged particle beam and within a distance equal to a pitch of the primary charged particle beams at the electro-photon converter unit. In the apparatus of embodiments of the present invention, the electron to photon converter sections are arranged close to the primary charged particle beams. Preferably, at least one electron to photon converter section of said array of electron to photon converter sections is arranged between two adjacent primary charged particle beams. By arranged the each electron to photon converter section close to a primary beam or even between two adjacent primary beams, the width of the multi-beam charged particle column can be reduces, which makes it easier to arranged multiple multi-beam charged particle column close to each other and to arrange more multi-beam charged particle columns within a certain area above the sample. Accordingly, the surface of the sample can be inspected more quickly, which increase the throughput for the inspection of samples.

It is possible to use a free space optical imaging for transporting light from said electron to photon converter section to a light detector, as for example described in US 2007/0272856, or to arrange the light detector directly above or on top of the electron to photon converter section. When the light detector is arranged directly above or on top of the electron to photon converter section, the photon transport unit does not need to have extra or separate component and is essentially established by the configuration of the array of electron to photon converter sections and the photo detectors.

In an embodiment, the photon transport unit comprises a plurality of optical fibers. In an embodiment, at least one optical fiber of said plurality of optical fibers has a first end, wherein the first end is arranged adjacent or attached to one of said electron to photon converter sections for coupling light from said electron to photon converter section into the optical fiber. In an embodiment, the at least one optical fiber of said plurality of optical fibers has a second end, wherein the second end is configured to project light from said optical fiber onto the photon detector or light detector. In an embodiment, at least the first end of said at least one optical fiber of said array of optical fibers is arranged between the trajectories of two adjacent primary charged particle beams of said multiple primary charged particle beams.

In an embodiment, at least one of the plurality of optical fibers is at least partially coated with a photo-reflecting layer. When using optical fibers which are coated with a photo-reflecting layer, the acceptance cone of the optical fibers is not limited by the conditions of total internal reflection, and the acceptance cone can be much larger. The acceptance cone represents all angles with respect to the longitudinal axis of the optical fiber at which photons may enter the optical fiber such that the photons will convey along the optical fiber. When using optical fibers with a photo-reflecting coating, the maximum angle at which light may enter the optical fiber so that the light will propagate along the optical fiber is much larger. An example of such a photo-reflecting layer is a mirror coating, for example using an aluminum coating which may be enhanced by dielectric coatings.

In an embodiment, at least one of the plurality of optical fibers is tapered towards the first end. In an embodiment, the at least one optical fiber is cut at said first end at an angle between 10° and 90° with respect to an central axis of said at least one optical fiber. When using a tapered optical fiber, the optical fiber can be more easily inserted in between and arranged next to the trajectories of the primary charged particle beams of the multi-beam charged particle column.

In an embodiment, at least one electron to photon converter section of said plurality of electron to photon converter sections is arranged between the trajectories of two adjacent primary charged particle beams of said multiple primary charged particle beams. Accordingly this embodiment advantageously utilizes the area between the trajectories of two adjacent primary charged particle beams to arrange the electron to photon converter section inside the plurality of primary charged particle beams. This provides a very compact multi-beam charged particle column and/or allows to arrange at least two multi-beam charged particle columns close to each other for inspecting adjacent parts of the surface of a sample.

In an embodiment, said plurality of electron to photon converter sections comprises a plurality of strips of luminescent material, wherein at least one strip of said plurality of strips is located next to the trajectory of a primary charged particle beam and within a distance equal to the pitch of the trajectories of the primary charged particle beams at the electron-photon converter unit. Preferably said plurality of strips are arranged in a plane, wherein said plane is arranged such that the trajectories of the primary charged particle beams traverse said plane in a direction substantially perpendicular to said plane.

In an embodiment, the plurality of electron to photon converter sections comprises or are a part of a plate or a layer of luminescent material. In an embodiment, the plate or layer of luminescent material is provided with passage openings for the primary charged particle beams. Preferably said plate or layer of luminescent material is arranged in a plane, wherein the plane is arranged such that the trajectories of the primary charged particle beams traverse said plane in a direction substantially perpendicular to said plane.

In an embodiment, the layer of luminescent material is arranged on top of an optically transparent carrier, such as a glass carrier. In an embodiment, the layer of luminescent material is preferably arranged at a side of said optically transparent carrier which is facing the electron collection unit. The electron to photon converter sections comprises any converting material having the property that converts an incident electrons into one or more photons. Examples are scintillating materials, for instance crystal scintillators such as YAG, YAP, NaI, etc. . . . , or plastic scintillators, or a fluorescent or phosphorescent materials. Within the meaning of this application such materials are also called luminescent materials.

In an embodiment, said electron to photon converter sections, in particular said strips of luminescent material, are coated with a photo-reflecting layer. Preferably the photo-reflecting layer is arranged at a side of said electron to photon converter sections which is facing away from the photon transport unit. Preferably the photo-reflecting layer is at least partially transparent for secondary electrons. This allows at least part of the secondary electrons to pass through the photo-reflecting layer. The secondary electrons that pass through the photo-reflecting layer are converted into photons by the converting material of the electron to photon converter sections. Only a part of the generated photons will be traveling in a direction towards the photon transport unit, which part may be transported by said photon transport unit to the photo detector. The part of the generated photons that is traveling opposite to the direction towards the photon transport unit, is reflected by the photo-reflecting layer and is substantially re-directed toward the photon transport unit after said reflection. Accordingly, the part of the generated photons that can be collected by the photon transport unit for transporting towards the photo detector can be increased.

In an embodiment, the multi-beam charged particle column comprises an optical axis, wherein the trajectories of the multiple primary charged particle beams are arranged in multiple rows, wherein each row extends in a first direction substantially perpendicular to the optical axis, wherein the rows are arranged next to each other in a second direction substantially perpendicular to said first direction and said optical axis. Accordingly the multi-beam charged particle column according to this embodiment comprises an array of charged particle beam trajectories which are arranged in multiple rows, which rows are arranged next to each other in a direction substantially perpendicular to the direction of the rows. Preferably the pitch between adjacent trajectories of the primary charged particle beams is substantially constant. Preferably the pitch between the rows of trajectories of the primary charged particle beams is substantially equal to the pits between adjacent trajectories of the primary charged particle beams in the rows.

In an embodiment, at least one of the plurality optical fibers of said photon transport unit is arranged at least partially in between two adjacent rows. Accordingly the space between the rows of the multiple primary charged particle beams is used to accommodate at least part of the optical fibers, in particular to arrange the first end of said optical fibers adjacent or attached to one of said electron to photon converter sections, in particular adjacent or attached to one of said strips of luminescent material.

In an embodiment, the emitter comprises a single thermal field emission source, preferably of the Schottky type, for emitting a diverging electron beam towards a beam splitter, wherein the beam splitter comprises a plate with multiple apertures which are arranged for creating multiple primary beams, one primary beam per aperture. In this embodiment, the multiple primary charged particle beams are primary electron beams.

In an embodiment, the multi-beam charged particle column comprises a collimator lens for substantially collimating the primary charged particle beams from the emitter. In an embodiment, the electron-photon converter is preferably arranged between the collimator lens and the sample holder, more preferably arranged between the collimator and the objective lens unit.

In an embodiment, the electron collection unit comprises a Wien deflector unit for providing a magnetic field to disentangle the primary charged particle beams from the secondary electron beams coming from the surface of the sample upon incidence of the primary charged particle beams. In an embodiment, such a Wien deflector unit in use comprise perpendicular electric and magnetic fields which are configured so that a deflection of the primary charged particle beams by the electric field is substantially equal to but in an opposite direction of a deflection of the primary charged particle beams by the magnetic field. In addition the electric and magnetic fields are configured so that the deflection of the secondary electrons by the electric field is substantially in the same direction as the deflection of the secondary electrons by the magnetic field.

According to a second aspect, a method for inspecting a surface of a sample using a multi-beam charged particle column is provided, wherein said method comprises the steps of:

operating one or more emitters for creating multiple primary charged particle beams directed along trajectories towards the surface of the sample, collimating the primary charged particle beams, focusing said multiple primary charged particle beams on said sample, guiding secondary electrons created in the sample upon incidence of the primary charged particle beams towards an electron-photon converter unit by means of an electron collection unit, converting at least part of the secondary electrons into photons by means of the electron-photon converter unit, wherein the electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit, wherein the electron collection unit is configured for projecting secondary electrons created in the sample by one of said primary charged particle beams to at least one of said electron to photon converter sections arranged at one side with respect to the trajectory of said one of the primary charged particle beams, and transporting light from said electron to photon converter sections to a photo detector.

In an embodiment, the method is performed by means of a multi-beam charged particle column or an embodiment thereof, as described above.

In an embodiment, the multi-beam charged particle column comprises at least one optical fiber wherein said at least one optical fiber has a first end, wherein the first end is arranged adjacent to or attached to one of said electron to photon converter sections, wherein the method comprises the step of:

coupling light from said electron to photon converter section into the optical fiber.

In an embodiment, the at least one optical fiber has a second end, wherein the method comprises the step of:

projecting light from the second end of said at least one optical fiber onto the photo detector.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

Embodiments of the invention will be elucidated on the basis of an exemplary embodiment shown in the attached drawings, in which.

DETAILED DESCRIPTION

Figure 1:
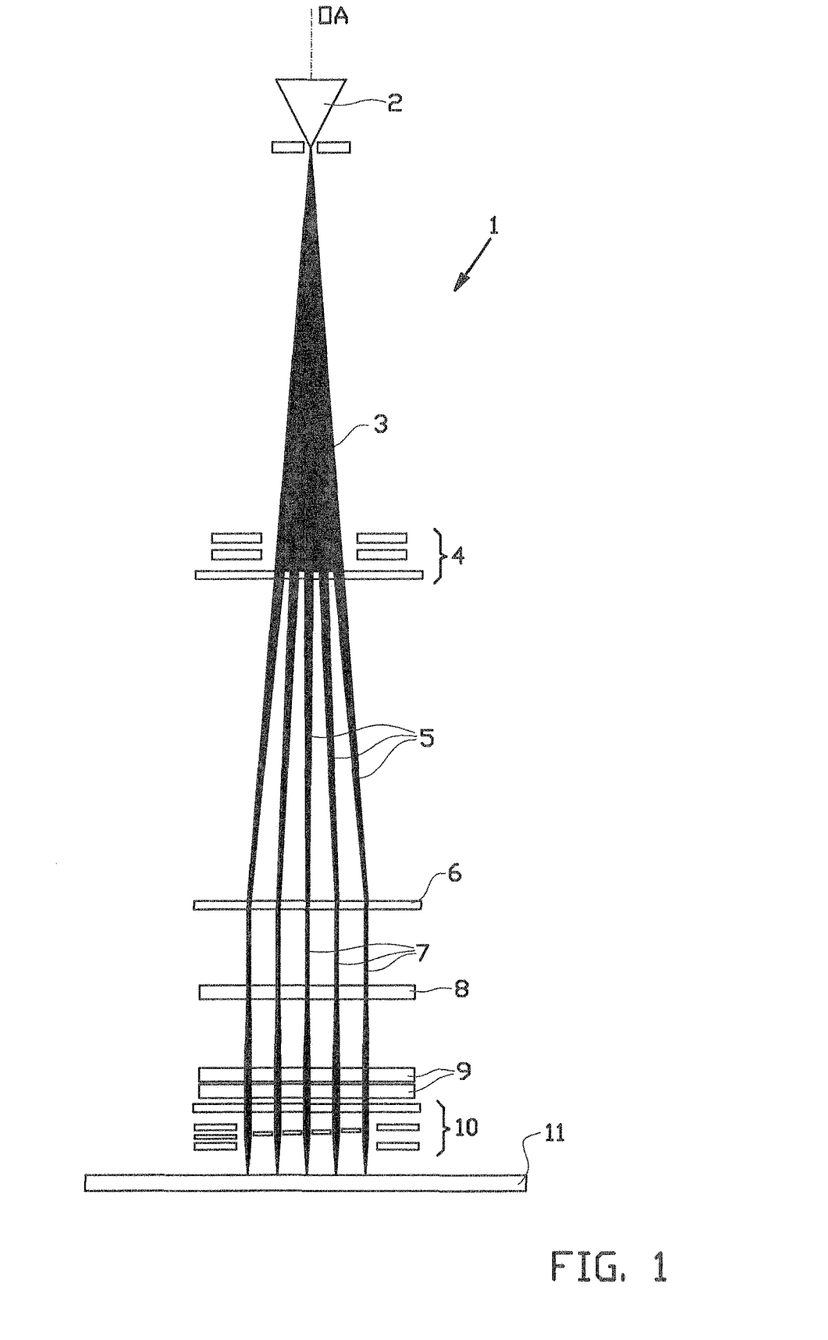
FIG. 1 schematically shows an example of a multi-beam charged particle column.

FIG. 1 shows a schematic representation of a multi-beam charged particle column 1 comprising an emitter 2, which is arranged substantially on an optical axis OA, for generating a diverging charged particle beam 3 which extends along said optical axis OA. Preferably, said emitter 2 comprises a Schottky source.

Downstream from said emitter 2, a lens array 4 is provided, which lens array 4 is provided with an aperture array for splitting the diverging charged particle beam 3 in multiple primary charged particle beams 5; each aperture of said aperture array provides one primary charged particle beam 5. In addition the lenses of the lens array 4 focusses each individual primary charged particle beam 5 at or near a collimator lens 6, which is arranged at a side of the lens array 4 facing away from the emitter 2.

Accordingly, the emitter 2 and the lens array 4 constitutes an arrangement for creating multiple primary charged particle beams 5, which multiple primary charged particle beams 5 are directed towards the surface of a sample 11.

The collimator lens 6 is arranged for substantially collimating the primary charged particle beams 5 from the emitter 2, in particular to direct each primary charged particle beam 5 substantially parallel to the optical axis OA. In embodiment, the collimator lens 6 comprises a deflector array which is arranged for deflecting the individual primary charged particle beams 5, in order to produce an array of primary charged particle beams 7 which are arranged substantially parallel to the optical axis OA as schematically shown in FIG. 1. Although a collimator is not strictly necessary, it makes the positioning of the components at the side of the collimator 6 facing away from the emitter 2, such as the objective lens unit, much less critical, at least in a direction along the optical axis OA.

Subsequently, a detector array 8 is arranged at the optical axis OA, which detector array 8 will be described in more detail with reference to FIGS. 2, 3 and 4 below. As schematically shown in FIG. 1, the detector array 8 is arranged to allow the primary charged particle beams 7 to travel through the detector array 8 towards an objective lens unit 10.

The objective lens unit 10 is arranged for focusing each one of said multiple primary charged particle beams 7 on said sample 11.

In between the objective lens unit 10 and the detector array 8, a Wien filter 9, e.g. a Wien deflector array, is arranged. In use, the Wien deflector array provides at least a magnetic field to disentangle the primary charged particle beams 7 and secondary electron beams coming from the surface of the sample 11 upon incidence of the primary charged particle beams 7, as will be explained in more detail below.

Figure 2:
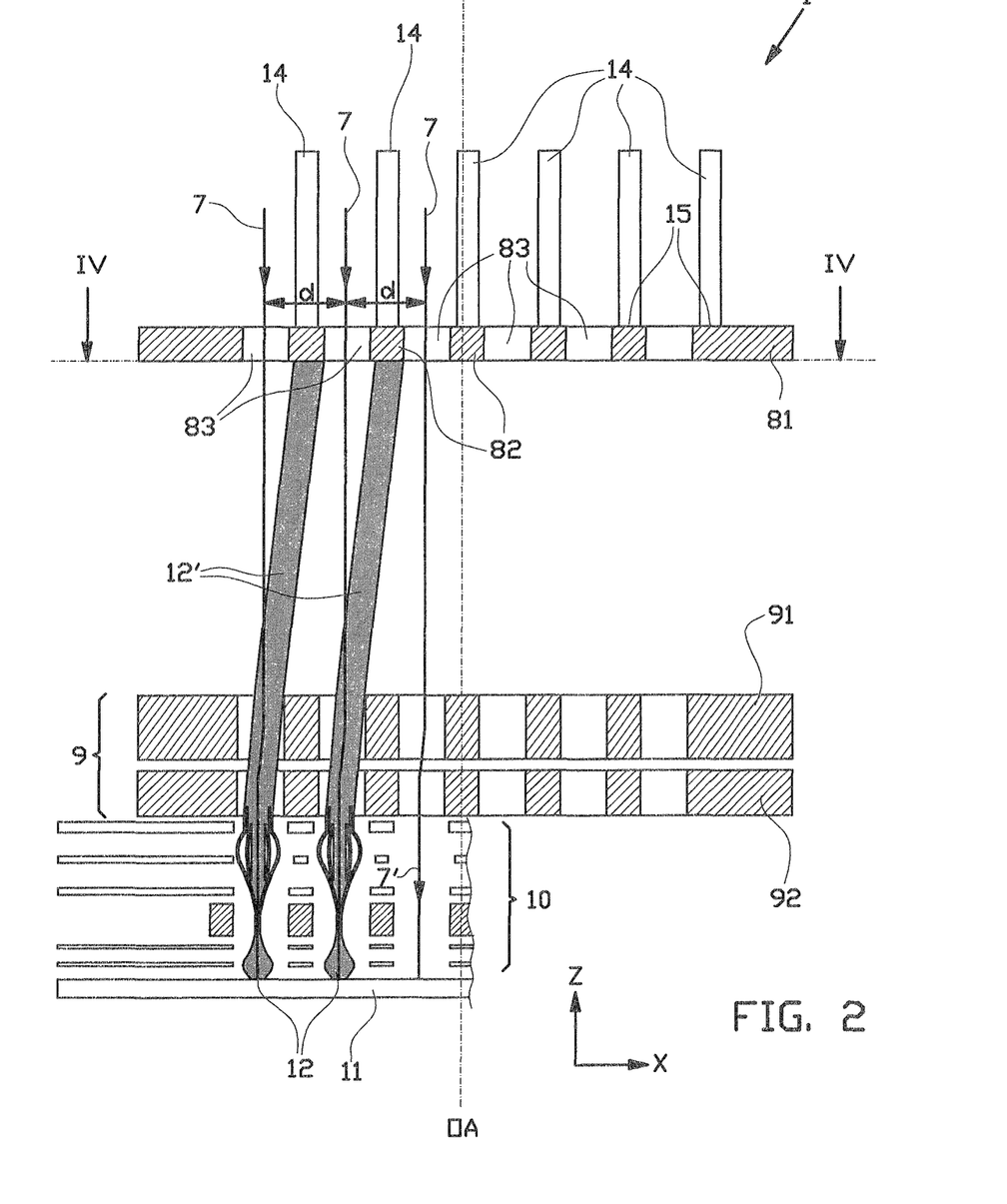
FIG. 2 schematically shows a first detailed view in the XZ plane of a part of the multi-beam charged particle column according to embodiments of the invention.
Figure 3:
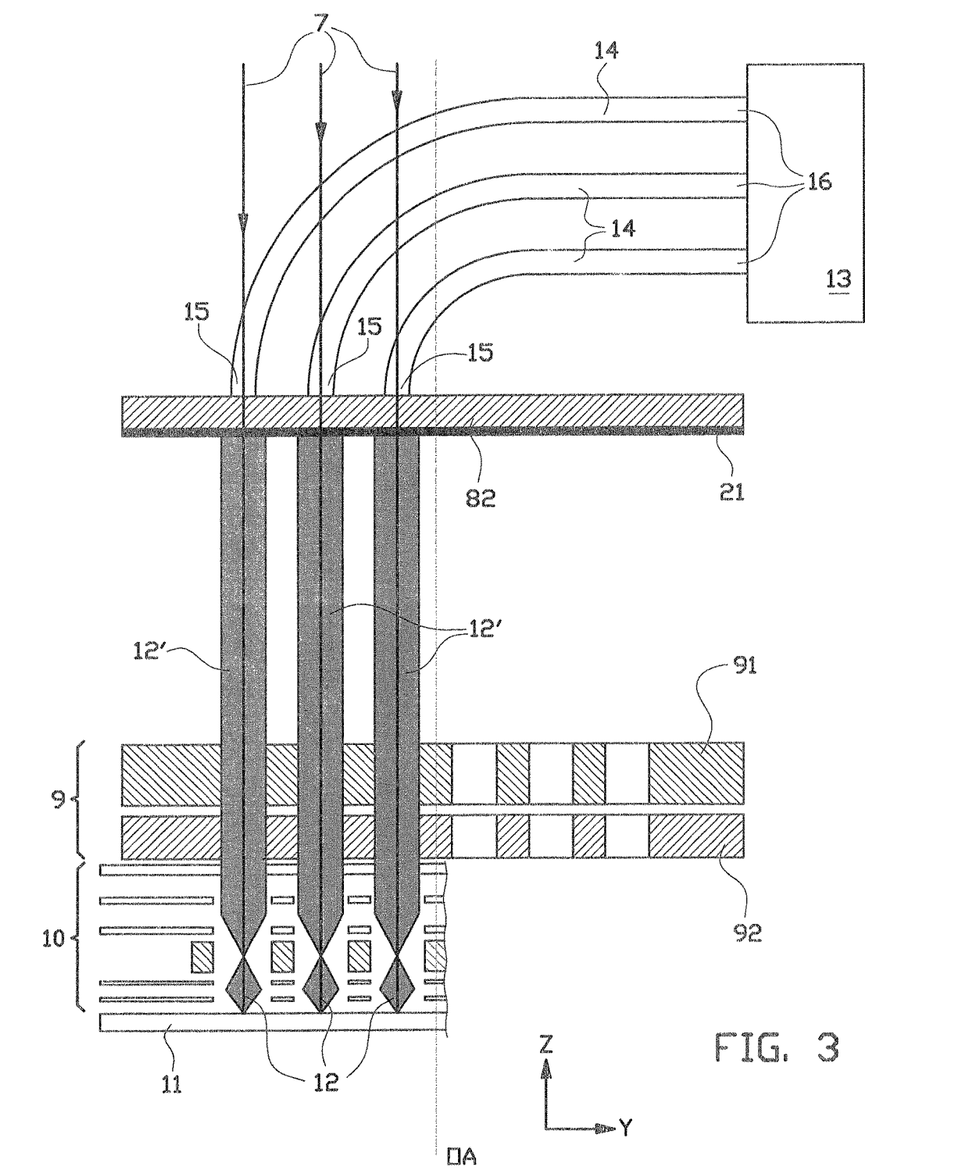
FIG. 3 schematically shows a first detailed view in the YZ plane of a part of the multi-beam charged particle column of FIG. 2.
Figure 4:
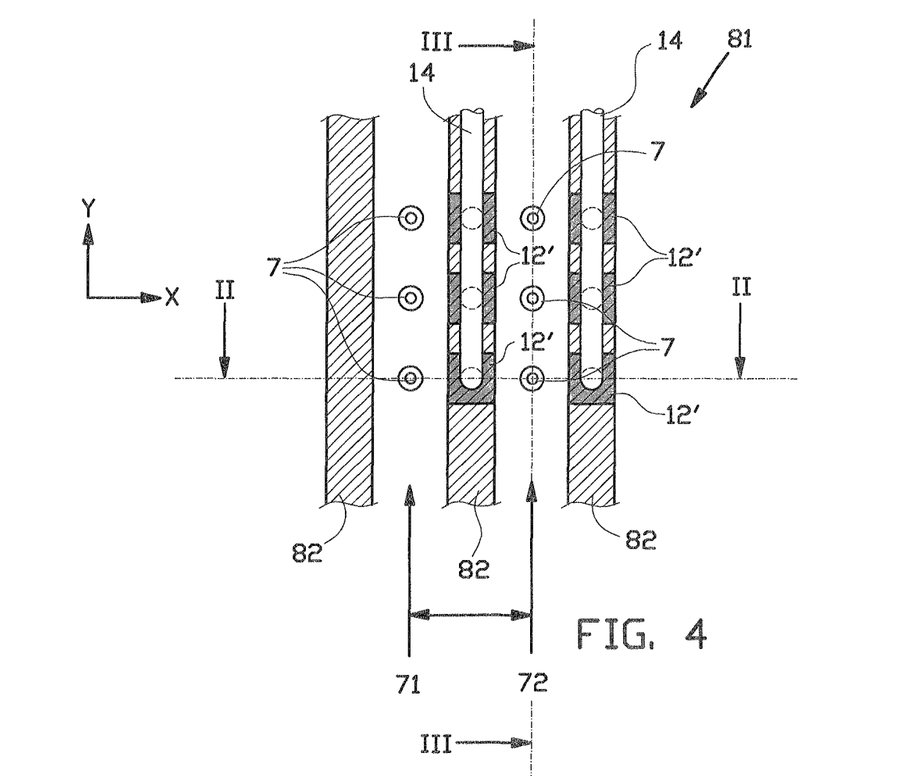
FIG. 4 schematically shows a first detailed view in the XY plane of a part of the multi-beam charged particle column of FIGS. 2 and 3.

FIGS. 2, 3 and 4 show different views of a part of an example of a multi-beam charged particle column according to embodiments of the invention. The part shown in FIGS. 2, 3 and 4 corresponds to the particular the part of the multi-beam charged particle column 1 of FIG. 1, below the collimator lens 6. The example shown in FIGS. 2, 3 and 4, comprises the same upper part of the charged particle column of FIG. 1, in particular the part above the detector array 8 for producing an array of primary charged particle beams 7 which are arranged substantially parallel to the optical axis OA.

According to the example shown in the FIGS. 2, 3 and 4, the multi-beam charged particle column 1' comprises an electron-photon converter unit 81 comprising an array electron to photon converter sections, in particular an array of fluorescent strips 82. Each fluorescent strip 82 is located in the plane of the electron-photon converter unit 81, next to a primary beam 7 and within a distance d equal to a pitch of the primary beams 7 at the electron-photon converter unit 81. As shown in the FIGS. 2 and 3 in particular, the multiple primary charged particle beams 7 traverses the plane of the electron-photon converter unit 81 which plane extends in a XY direction, substantially perpendicular to the optical axis OA.

It is noted that at least one strip of said array of fluorescent strips 82 is arranged between two adjacent primary charged particle beams 7 of said multiple primary charged particle beams.

It is further noted that in the example shown in FIGS. 2, 3 and 4, the electron-photon converter unit 81 comprises a series of parallel arranged fluorescent strips 82 which extend substantially in the Y-direction. However, the electron-photon converter unit may alternatively also a plate of a fluorescent material with through holes or openings 83 for the primary charged particle beams 7, which plate of fluorescent material extends in the XY direction. The parts of such a plate which extend in the X or Y direction in between the through holes for the primary charged particle beams 7, are also considered to be fluorescent strips in accordance with embodiments of the present invention.

As schematically indicated in FIG. 2, the primary charged particle beams 7 travel through the plane of the electron-photon converter unit 81, via the openings 83 between the fluorescent strips 82, towards the Wien filter 9. The Wien filter comprises a combination of a magnetic deflector 91 and an electrostatic deflector 92. In use, the electrostatic deflector 92 is arranged to at least substantially counteract the deflection of the magnetic deflector 91 for the primary charged particle beams 7. Accordingly, the primary charged particle beams 7' which have traversed the Wien filter, are shifted to a small extend in the X-direction, but are still arranged substantially parallel to the optical axis OA, and thus substantially parallel to the primary charged particle beams 7 above the Wien filter 9.

Subsequently, the primary charged particle beams 7' are focused onto a sample 11 via an objective lens unit 10.

The objective lens unit 10 comprises an electron collection unit comprising multi aperture plates for, in use, guiding secondary electrons 12 created in the sample 11 upon incidence of the primary charged particle beams 7', towards the Wien filter 9. For the secondary electrons 12, which travel in opposite direction with respect to the primary charged particle beams 7, 7', the electrostatic deflector 92 does not counteract the deflection of the magnetic deflector 91, but now the deflections of the secondary electrons 12 by the electrostatic deflector 92 and the magnetic deflector 91 add up. Accordingly, the secondary electrons 12' which have passed the Wien filter are no longer traveling substantially parallel to the optical axis OA, but are deflected to travel at an angle with respect to the optical axis OA in order to project the secondary electrons 12' onto the fluorescent strips 82 of the electron-photon converter unit 81, as schematically shown in FIG. 2.

At the fluorescent strips 82 of the electron-photon converter unit 81, photons are created upon incidence of the secondary electrons 12'. At least a part of said photons are transported from the fluorescent strip 82 to a photo detector 13 via a photon transport unit. In the example as shown in FIGS. 2 and 3 and according to embodiments of the present invention, said photon transport unit comprises an array of optical fibers 14. Each optical fiber 14 comprises a first end 15 which is arranged adjacent or attached to one of said fluorescent strips 82 for coupling light (photons) from said fluorescent strip 82 into the optical fiber 14, and a second end 16 which is arranged to project light from said optical fiber 14 onto the photo detector 13.

As schematically shown in FIG. 2, the first end 15 of the optical fibers 14 of said array of optical fibers is arranged between two adjacent primary charged particle beams 7 of said multiple primary charged particle beams.

FIG. 4 shows a schematic top view at the plane of the electron-photon converter unit 81, in particular in the XY plane which extends substantially perpendicular to the optical axis OA, as indicated in FIG. 2 by the reference IV-IV. As shown in FIG. 4, the multiple primary charged particle beams 7 are arranged in multiple rows 71, 72, wherein each row 71, 72 extends in a first direction, in this example in the Y-direction, substantially perpendicular to the optical axis OA as schematically shown in FIG. 3. The rows 71, 72 of primary charged particle beams 7 are arranged next to each other in a second direction, in this example in the X-direction, substantially perpendicular to said first direction and said optical axis OA. The fluorescent strips 82 of the electron-photon converter unit 81, are arranged next to a row 71, 72 of primary charged particle beams 7 and within a distance equal to a pitch d of the rows 71, 72 of the primary charged particle beams 7 at the electron-photon converter unit 81. As schematically indicated in FIG. 4, the openings 83 between the fluorescent strips 82 are arranged to allow passage of the primary charged particle beams 7 through the plane of the electron-photon converter unit 81.

In use, secondary electrons 12' created in the sample 11 upon incidence of the primary charged particle beams 7, are deflected by the Wien filter 9 in the X-direction and are projected onto the fluorescent strips 82 of the electron-photon converter unit 81, as schematically shown in FIG. 4. The secondary electrons 12' incident on the fluorescent strips 82 at a side facing the Wien filter 9, are converted by fluorescent material of the fluorescent strips 82 into photons (light). At a side of the fluorescent strips 82 facing away from the Wien filter, in particular at or near the position where the secondary electrons 12' are deflected to, optical fibers 14 are arranged to collect at least part of the created photons and to guide the collected photons a photo detector 13, as schematically shown in FIG. 3. All the optical fibers 14 which are arranged to collect the photons from the various spots of secondary electrons 12' on a specific fluorescent strip 82, are arranged above said fluorescent strip 82, in particular in a ZY plane, at least the parts of the optical fibers 14 which is arranged next to or in between the rows 71, 72 of primary charged particle beam 7. As schematically shown in FIG. 3, the optical fibers 14 are bent or curved in the YZ plane in order to arranged the second end 16 of the fibers at least out of the area of the primary charged particle beams 7 to project light from said optical fiber 14 onto the photo detector 13. The bended or curved optical fibers 14 are substantially confined to the area above the fluorescent strips 82 in order to circumvent that the optical fibers 14 get in the way of the primary charged particle beams 7. The assembly of optical fibers 14 constitute a photon transport unit according to embodiments of the present invention.

The photons created by the conversion of the secondary electrons 12' in the fluorescent strips 82 may also be emitted in a direction away from the first end 15 of the optical fibers 14. In order to redirect these photons back towards the first end 15 of the optical fibers 14, the fluorescent strips 82 may be coated with a photo-reflecting layer 21 at a side of said fluorescent strips 82 facing away from the first end 15 of the optical fibers 14, as schematically indicated in FIG. 3. Preferably, the photo-reflecting layer 21 is substantially transparent for the secondary electrons 12', so that at least a substantial amount of the secondary electrons 12' reach the fluorescent material of the fluorescent strips 82 and is converted into photons.

Figure 5:
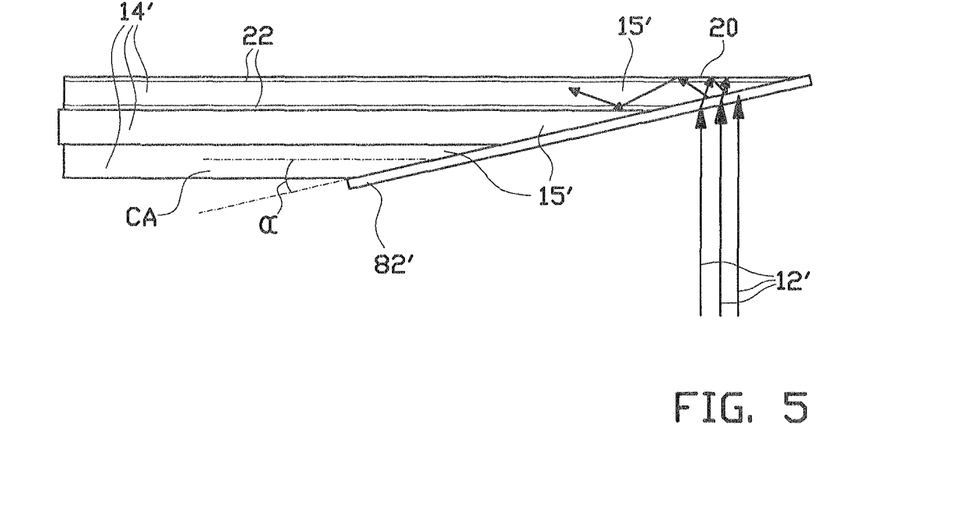
FIG. 5 schematically shows detailed view of a part of a second example of a photon transport unit, and FIG. 6 schematically shows a detailed view in the XZ plane of a part of the multi-beam charged particle column according to a second example of a multi-beam charged particle column according to embodiments of the invention.

An alternative of the curved or bent optical fibers 14, is shown in FIG. 5. In this alternative example, the optical fibers 14' are tapered towards the first end 15'. The first end 15' of the optical fibers 14' are cut at an angle $\alpha$ between 10° and 90° with respect to an central axis CA of said optical fibers 14'. At the tapered first end 15' of the optical fibers 14', a fluorescent plate or a fluorescent layer 82' is arranged, which in use may be arranged instead of and at the position of the fluorescent strips 82 in the example of FIGS. 2, 3 and 4. The secondary electrons 12' which are projected onto the fluorescent plate or fluorescent layer 82' are converted into photons 20. At least part of the generated photons 20 are coupled into the first end 15' of the optical fibers 14' and are conveyed or directed through said optical fiber 14' towards a photo-detector. The photons 20 are confined inside optical fiber 14' due to total internal reflection at the side surface of the optical fibers 14'. Alternatively, the optical fibers 14' may be at least partially coated with a photo-reflecting layer 22, as schematically indicated at one of the fibers 14' in FIG. 5.

Figure 6:
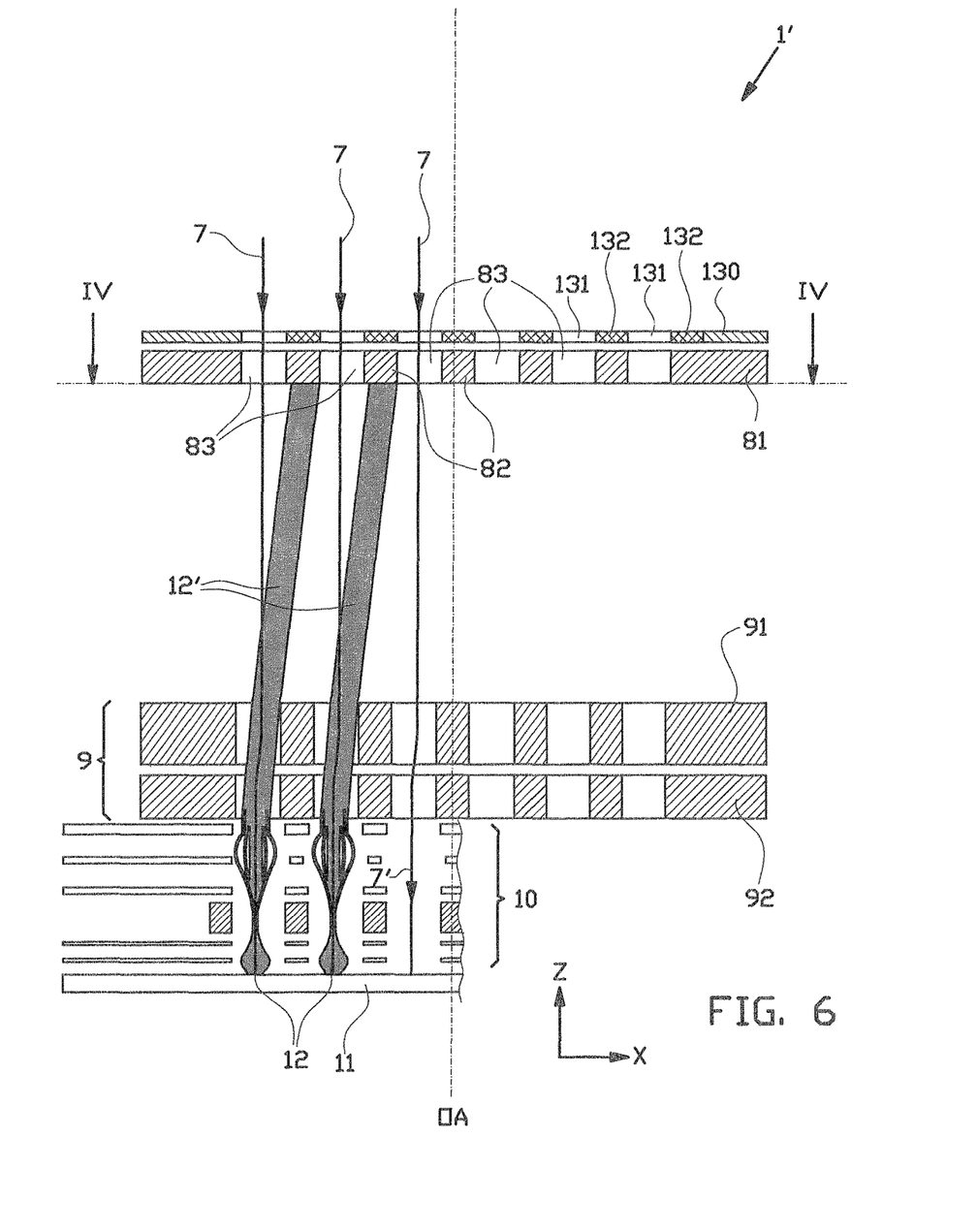

As discussed above, it is also possible to arrange the photo detector 130 directly above or on top of the electron to photon converter sections (e.g. fluorescent strip 82), as schematically shown in a second example shown in FIG. 6. According to this example, the photo detector 130 comprises an array of through holes 131 for the primary charged particle beams 7. The photo detector 130 preferably comprises an array of photo detector sections 132, each of said photo detector section 132 is arranged directly above or on top of one of the electron to photon converter sections (e.g. fluorescent strip 82). Accordingly, the photon transport unit does not need to have extra or separate components, such as optical fibers, and is essentially established by the configuration of the array of electron to photon converter sections and the array of photo detector sections 132.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

It is noted that in use the charged particle beams, in particular the primary charged particle beams, travel along the corresponding trajectories of the charged particle beams, and the representation of the charged particle beams in the enclosed figures also depict the corresponding trajectories of the charged particle beams. When not in use, the charged particle beams are not present in the multi-beam charged particle column. However, the trajectories, which represent the path the charged particle beams follow when the multi-beam charged particle column is in use, can be defined even if the multi-beam charged particle column is not in use.

In summary, embodiments of the present invention relates to an apparatus and method for inspecting a surface of a sample. Said apparatus comprises a multi-beam charged particle column comprising arranged source for creating multiple primary beams directed towards the sample, an objective lens for focusing said primary beams on said sample, an electron-photon converter unit comprising an array of electron to photon converter sections, each section is located next to a primary beam within a distance equal to a pitch of the primary beams at the electro-photon converter unit, a photon transport unit for transporting light from said electron to photon converter sections to a photo detector, and an electron collection unit for guiding secondary electrons created in the sample, towards the electron-photon converter unit. The electron collection unit is arranged to project secondary electrons created in the sample by one of said primary beams to at least one of said electron to photon converter sections.

The invention claimed is:

1. A multi-beam charged particle column for inspecting a surface of a sample, which multi-beam charged particle column comprising:
   one or more emitters which are arranged for creating multiple primary charged particle beams directed along trajectories towards the surface of the sample,
   an objective lens unit for focusing said multiple primary charged particle beams on said sample,
   an electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit,
   a photon transport unit for transporting light from said electron to photon converter sections to a light detector, and
   an electron collection unit comprising multi aperture plates for guiding secondary electrons created in the sample upon incidence of the primary charged particle beams, towards the electron to photon converter sections of the electron-photon converter unit, wherein the electron collection unit is configured for projecting secondary electrons created in the sample by one of said primary charged particle beams to at least one of said electron to photon converter sections arranged at one side with respect to the trajectory of said one of the primary charged particle beams.

2. The multi-beam charged particle column according to claim 1, wherein at least one electron to photon converter section of said plurality of electron to photon converter sections is arranged between the trajectories of two adjacent primary charged particle beams of said multiple primary charged particle beams.

3. The multi-beam charged particle column according to claim 1, wherein said photon transport unit comprises a plurality of optical fibers.

4. The multi-beam charged particle column according to claim 3, wherein at least one optical fiber of said plurality of optical fibers has a first end, wherein the first end is arranged adjacent to or attached to one of said electron to photon converter sections for coupling light from said electron to photon converter section into the optical fiber.

5. The multi-beam charged particle column according to claim 4, wherein the at least one optical fiber of said plurality of optical fibers has a second end, wherein the second end is configured to project light from said optical fiber onto the photo detector.

6. The multi-beam charged particle column according to claim 3, wherein at least one optical fiber of said plurality of optical fibers has a first end, wherein the first end is arranged between the trajectories of two adjacent primary charged particle beams of said multiple primary charged particle beams.

7. The multi-beam charged particle column according to claim 3, wherein at least one of the plurality of optical fibers is at least partially coated with a photo-reflecting layer.

8. The multi-beam charged particle column according to claim 1, wherein at least one of the plurality of optical fibers is tapered towards the first end.

9. The multi-beam charged particle column according to claim 8, wherein the at least one optical fiber is cut at said first end at an angle between 10° and 90° with respect to an central axis of said at least one optical fiber.

10. The multi-beam charged particle column according to claim 1, wherein said plurality of electron to photon converter sections comprises a plurality of strips of luminescent material, wherein at least one strip of said plurality of strips is located next to the trajectory of a primary charged particle beam and within a distance equal to the pitch of the trajectories of the primary charged particle beams at the electron-photon converter unit.

11. The multi-beam charged particle column according to claim 1, wherein said plurality of electron to photon converter sections comprises a plate or a layer of luminescent material.

12. The multi-beam charged particle column according to claim 11, wherein the plate or the layer of luminescent material is provided with passage openings for the primary charged particle beams.

13. The multi-beam charged particle column according to claim 1, wherein said plurality of electron to photon converter sections are at least partially coated with a photo-reflecting layer.

14. The multi-beam charged particle column according to claim 1, wherein the multi-beam charged particle column comprises an optical axis, wherein the trajectories of the multiple primary charged particle beams are arranged in multiple rows, wherein each row extends in a first direction substantially perpendicular to the optical axis, wherein the rows are arranged next to each other in a second direction substantially perpendicular to said first direction and said optical axis.

15. The multi-beam charged particle column according to claim 14, wherein said photon transport unit comprises a plurality of optical fibers, wherein at least one of the plurality of optical fibers is at least partially arranged in between two adjacent rows.

16. The multi-beam charged particle column according to claim 1, wherein the one or more emitters comprises a single thermal field emission source for emitting a diverging charged particle beam towards a beam splitter, wherein the beam splitter comprises a plate with multiple apertures which are arranged for creating multiple primary charged particle beams, one primary charged particle beam per aperture.

17. The multi-beam charged particle column according to claim 1, wherein the electron collection unit comprises a Wien deflector unit for providing a magnetic field to disentangle the primary charged particle beams from the secondary electron beams coming from the surface of the sample upon incidence of the primary charged particle beams.

18. Method for inspecting a surface of a sample using a multi-beam charged particle column, wherein said method comprising the steps of:
 operating one or more emitters for creating multiple primary charged particle beams directed along trajectories towards the surface of the sample,
 focusing said multiple primary charged particle beams on said sample,
 guiding secondary electrons created in the sample upon incidence of the primary charged particle beams towards an electron-photon converter unit using an electron collection unit,
 converting at least part of the secondary electrons into photons using the electron-photon converter unit, wherein the electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit, wherein the electron collection unit is configured for projecting secondary electrons created in the sample by one of said primary charged particle beams to at least one of said electron to photon converter sections arranged at one side with respect to the trajectory of said one of the primary charged particle beams, and
 transporting light from said electron to photon converter sections to a photo detector.

19. The method according to claim 18, wherein said multi-beam charged particle column comprises at least one optical fiber wherein said at least one optical fiber has a first end, wherein the first end is arranged adjacent to or attached to one of said electron to photon converter sections, wherein the method comprises the step of:
 coupling light from said electron to photon converter section into the optical fiber.

20. The method according to claim 19, wherein the at least one optical fiber has a second end, wherein the method comprises the step of:
 projecting light from the second end of said at least one optical fiber onto the photo detector.

* * * * *